US009240756B1

(12) United States Patent
Helms et al.

(10) Patent No.: US 9,240,756 B1
(45) Date of Patent: Jan. 19, 2016

(54) HIGH LINEARITY, HIGH EFFICIENCY, LOW NOISE, GAIN BLOCK USING CASCODE NETWORK

(71) Applicant: Lockheed Martin Corporation, Bethesda, MD (US)

(72) Inventors: David R. Helms, Tyngsboro, MA (US); James Sweder, Mount Laurel, NJ (US); Brett Ingersoll, Everett, MA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 13/795,938

(22) Filed: Mar. 12, 2013

(51) Int. Cl.
*H03F 1/02* (2006.01)
*H03F 1/22* (2006.01)

(52) U.S. Cl.
CPC ................ *H03F 1/0205* (2013.01); *H03F 1/22* (2013.01)

(58) Field of Classification Search
CPC ......... H03F 3/193; H03F 3/211; H03F 1/223; H03F 2200/294; H03F 3/68; H03F 3/195; H03F 3/245; H03F 1/0205; H03F 2200/222; H03F 3/45179; H03F 1/565; H03F 2200/108; H03F 2200/489; H03F 3/16; H03F 1/22; H03F 2200/372
USPC .................................. 330/277, 310, 283, 311
See application file for complete search history.

(56) References Cited

U.S. PATENT DOCUMENTS

| | | | | |
|---|---|---|---|---|
| 4,550,291 | A | 10/1985 | Millaway et al. | |
| 4,587,495 | A | 5/1986 | Osawa et al. | |
| 5,451,906 | A | 9/1995 | Kaltenecker | |
| 5,661,436 | A | 8/1997 | Kresock | |
| 6,107,885 | A | 8/2000 | Miguelez et al. | |
| 6,147,559 | A | 11/2000 | Fong | |
| 6,744,322 | B1 | 6/2004 | Ma et al. | |
| 6,850,120 | B2 * | 2/2005 | Heima et al. | 330/311 |
| 6,864,750 | B2 * | 3/2005 | Shigematsu | 330/311 |
| 7,205,836 | B2 | 4/2007 | Helms et al. | |
| 7,378,912 | B2 * | 5/2008 | Tanahashi et al. | 330/311 |
| 7,605,655 | B2 | 10/2009 | Kim et al. | |
| 7,701,289 | B2 | 4/2010 | Kuo et al. | |
| 7,714,664 | B2 * | 5/2010 | Kanaya et al. | 330/311 |
| 7,911,279 | B2 * | 3/2011 | Chow et al. | 330/311 |
| 8,018,288 | B2 | 9/2011 | Duster et al. | |
| 2011/0163810 | A1 | 7/2011 | Thomas | |
| 2013/0229237 | A1 * | 9/2013 | Takenaka | 330/311 |

* cited by examiner

*Primary Examiner* — Khanh V Nguyen
(74) *Attorney, Agent, or Firm* — Howard IP Law Group, PC

(57) ABSTRACT

A two-stage RF amplifier comprising first and second transistors arranged in cascode. The first transistor cooperatively connected to an input RF signal source through a parallel RC network. The gate of the second transistor terminated with a lossy connection.

8 Claims, 1 Drawing Sheet

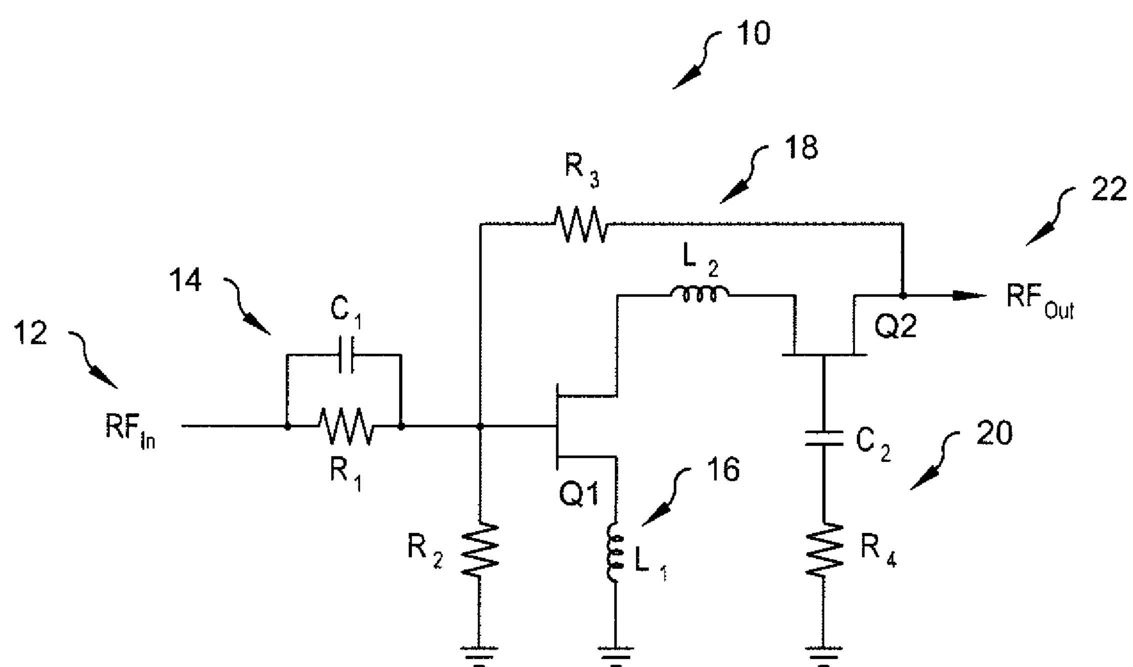
10
18
22
14
12
R3
L2
C1
RFOut
Q2
RFIn
R1
C2
20
Q1
16
R2
L1
R4

HIGH LINEARITY, HIGH EFFICIENCY, LOW NOISE, GAIN BLOCK USING CASCODE NETWORK

FIELD OF THE INVENTION

The present invention relates to power amplifiers, and more particularly, to amplifiers used in high dynamic range (HDR) systems.

BACKGROUND

Next generation radar systems require an order of magnitude greater dynamic range, without additional power consumption. These components must have low gain, low noise, low power dissipation and high linearity. Cascode amplifier arrangements, including those utilizing FETs, are known to improve some of these characteristics, however, as presently implemented, these amplifier arrangements are not sufficiently linear.

High dynamic range (HDR) systems must receive both high and low level signals concurrently. The key to HDR is high inception point and low noise. The higher the inception point, the stronger the processable signal. The lower the noise FIGURE, the weaker the processable signal. Current HDR systems also require low dissipated power. High inception can be achieved by using large power amplifiers but place a heavy burden on a system's prime power, fuel usage and system cost.

These drawbacks have been addressed using higher-power devices, which draw excess DC power, resulting in reduced system efficiency. Alternatively, silicon (Si) bipolar junction transistor (BJT) devices may be used, however, at the expense of increased noise.

Alternative systems and methods are desired for improving RF power limiting over a wide bandwidth, reducing power leakage, and improving packaging and production capabilities.

SUMMARY

According to one embodiment of the present invention, a cascode amplifier is provided. The amplifier includes an input stage including a common source transistor having a gate terminal responsive to an input signal, and an output stage including a common gate transistor having a source terminal operatively connected to the drain terminal of the common source transistor. At least one capacitor and at least one resistor are arranged in series between a ground reference and the gate terminal of the common gate transistor.

A method of amplifying an input signal is also provided. The method includes the steps of providing a first and a second transistor configured as a two-stage cascode amplifier, and connecting a resistor-capacitor network between an input signal source and the gate terminal of the first transistor.

BRIEF DESCRIPTION OF THE DRAWINGS

FIG. 1 is circuit diagram of a cascode amplifier according an embodiment of the present invention.

DETAILED DESCRIPTION

It is to be understood that the FIGURES and descriptions of the present invention have been simplified to illustrate elements that are relevant for a clear understanding of the present invention, while eliminating, for purposes of clarity, many other elements found in RF circuits, including two-stage RF amplifiers. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

Embodiments of the present disclosure are aimed at providing improved gain block amplifier arrangements offering low gain, low noise, low power consumption and high linearity over devices of the prior art. Embodiments include cascode amplifier circuits utilizing impulse implanted field-effect transistors (FETs), such as pulse or spiked doped FETs, providing improved linearity over conventional transistors. The cascode amplifier arrangements set forth herein comprise a two-stage circuit consisting of a first transconductance amplifier followed by a second buffer amplifier. In one exemplary embodiment, the first amplifier is configured as a common source FET with an input voltage applied to its gate, and the second amplifier configured as a common base FET driven by the first amplifier stage. The combination of high-linearity cascode arrangements, as well as FETs with improved linearity yield significant improvements over devices of the prior art.

Further, cascode arrangements according to embodiments of the present disclosure implement several unique features, including source feedback and a parallel resistor-capacitor (R/C) network arranged on the input of the amplifier provides for a generally flat gain slope. An inter-stage inductor may be provided between the common gate and common source FETs. Finally, lossy capacitive reactance may be used to terminate the gate of the second common base FET.

Referring generally to FIG. 1, an exemplary gain block amplifier 10 is provided. Amplifier 10 is responsive to a radio frequency (RF) input source 12 operatively connected to the gate terminal of a common source transistor Q1 comprising the first amplifier stage. A second amplifier stage comprising transistor Q2 is arranged in cascode with Q1, having its source terminal connected to the drain terminal of transistor Q1. In one embodiment of the present disclosure, the gate terminal of transistor Q2 is terminated to a reference potential (e.g. ground reference) via a lossy network 20, by way of non-limiting example only, a capacitor C2 and resistor R4 arranged in series. This lossy termination provides for improved RF stability above the operating band, eliminating amplifier oscillation, as well as a greater operation RF band.

In one exemplary embodiment of the present disclosure, the first and second amplifier stages may be connected via an inter-stage inductance. In the illustrated embodiment, inductor L2 is arranged between the output drain terminal of the first stage transistor Q1, and the input source terminal of the second stage transistor Q2. Inductor L2 acts to match or absorb the intrinsic capacitances of transistors Q1 and Q2, providing greater RF bandwidth and greater RF gain.

A parallel resistor-capacitor (RC) network may be provided between the input source 12 and the gate terminal of transistor Q1. This arrangement provides for a generally flat gain. Specifically, the RC network acts as a diplexer, flattening RF gain response by forcing lower frequencies through the resistor and allowing higher frequencies to pass through the capacitor. In the illustrated embodiment, an inductive source feedback network 16 including at least one inductor L1 is arranged between the source terminal of transistor Q1 and a ground reference for improving the input match of the amplifier. A biasing network 18 comprising one or more resistors, resistors R2 and R3 as illustrated, is arranged between the reference potential (ground) and the drain terminal of transistor Q2.

Embodiments of the present disclosure have been implemented with field effect transistors (FETs). Improvements on the performance of the above-described cascode amplifiers may be realized through altering the composition of these FETs, increasing their linearity. For example, spike, or non-uniform, doping may be implemented, resulting in FETs having reduced intrinsic capacitance variation.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A cascode amplifier comprising:

an input stage including a common source transistor having a gate terminal responsive to an input signal;

an output stage including a common gate transistor having a source terminal operatively connected to the drain terminal of the common source transistor;

a first inductor arranged between the drain terminal of the common source transistor and the source terminal of the common gate transistor;

a second inductor arranged between the source terminal of the common source transistor and a reference potential; and a resistor-capacitor network responsive to the input signal and defined by a resistor and a capacitor arranged in parallel, whose output is directly connected to the gate terminal of the common source transistor, wherein the common source and common gate transistors are impulse implanted, spike-doped field-effect transistors.

2. The amplifier of claim 1, further comprising a biasing network arranged between the drain terminal of the common gate transistor and the reference potential.

3. The amplifier of claim 2, wherein the biasing network comprises a plurality of resistors arranged in series.

4. The amplifier of claim 1, wherein the reference potential is a ground reference.

5. The amplifier of claim 1, further comprising at least one capacitor and at least one resistor arranged in series between the reference potential and the gate terminal of the common gate transistor.

6. A method of amplifying an input signal, said method comprising the steps of:

receiving the input signal with a first transistor of a two-stage cascode amplifier via a resistor-capacitor network defined by a resistor and a capacitor arranged in parallel, having an input responsive to an input signal source and an output directly coupled to a gate terminal of the first transistor;

amplifying the input signal with the first transistor;

receiving an amplified output signal of the first transistor with a second transistor via a first inductor arranged between a drain terminal of the first transistor and a source terminal of the second transistor; and amplifying the output signal of the first transistor with the second transistor;

wherein a second inductor is arranged between a source terminal of the first transistor and a reference potential, and wherein the first and second transistors are configured as spike-doped field-effect transistors.

7. The method of claim 6, wherein a gate terminal of the second transistor is connected to the reference potential via a capacitor and a resistor arranged in series.

8. The method of claim 7, wherein the reference potential is a ground reference.

* * * * *